(12) United States Patent  
Zhang et al.

(10) Patent No.: US 9,391,018 B2  
(45) Date of Patent: Jul. 12, 2016

(54) CROSSTALK POLARITY REVERSAL AND CANCELLATION THROUGH SUBSTRATE MATERIAL TUNING

(71) Applicant: Intel Corporation, Santa Clara, CA (US)

(72) Inventors: Zhichao Zhang, Chandler, AZ (US); Tolga Memioglu, Chandler, AZ (US); Tao Wu, Chandler, AZ (US); Kemal Aygun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/171,714

(22) Filed: Feb. 3, 2014

(65) Prior Publication Data

US 2014/0151875 A1  Jun. 5, 2014

Related U.S. Application Data

(62) Division of application No. 13/665,741, filed on Oct. 31, 2012, now Pat. No. 8,643,184.

(51) Int. Cl.
*H01L 21/768* (2006.01)
*H01L 23/522* (2006.01)
(Continued)

(52) U.S. Cl.
CPC ...... *H01L 23/5226* (2013.01); *H01L 21/76877* (2013.01); *H01L 23/49822* (2013.01); *H01L 23/66* (2013.01); *H01L 24/16* (2013.01); *H01L 2224/131* (2013.01); *H01L 2224/13082* (2013.01); *H01L 2224/13147* (2013.01); *H01L2224/16237* (2013.01); *H01L 2924/15311* (2013.01)

(58) Field of Classification Search
CPC .............. H01L 21/4846; H01L 23/485; H01L 23/49816; H01L 23/49822; H01L 23/5222; H01L 23/5387; H01L 23/5389; H01L 24/05; H01L 24/82
See application file for complete search history.

(56) References Cited

U.S. PATENT DOCUMENTS 5,994,766 A * 11/1999 Shenoy et al. ................. 257/659
7,088,215 B1 * 8/2006 Winter et al. ................. 336/200
(Continued)

OTHER PUBLICATIONS

GETEJ Material: Low Dk/Df Laminate and Prepreg; 2006 Isola Group.*
ANADIGICS: Application Note Thermal Design for AWM6432 2008.*

*Primary Examiner* — Pamela E Perkins
(74) *Attorney, Agent, or Firm* — Blakely, Sokoloff, Taylor & Zafman LLP

(57) ABSTRACT

Transmission lines with a first dielectric material separating signal traces and a second dielectric material separating the signal traces from a ground plane. In embodiments, mutual capacitance is tuned relative to self-capacitance to reverse polarity of far end crosstalk between a victim and aggressor channel relative to that induced by other interconnect portions along the length of the channels, such as inductively coupled portions. In embodiments, a transmission line for a single-ended channel includes a material of a higher dielectric constant within the same routing plane as a microstrip or stripline conductor, and a material of a lower dielectric constant between the conductor and the ground plane(s). In embodiments, a transmission line for a differential pair includes a material of a lower dielectric constant within the same routing plane as a microstrip or stripline conductors, and a material of a higher dielectric constant between the conductors and the ground plane(s).

15 Claims, 6 Drawing Sheets

(51) Int. Cl.
*H01F 5/04* (2006.01)
*H01F 27/28* (2006.01)
*H01L 23/498* (2006.01)
*H01L 23/66* (2006.01)
*H01L 23/00* (2006.01)

(56) References Cited

U.S. PATENT DOCUMENTS

2004/0070080 A1* 4/2004 Pendse .................... 257/778
2009/0179722 A1* 7/2009 Goyette et al. ............ 336/186

* cited by examiner

CROSSTALK POLARITY REVERSAL AND CANCELLATION THROUGH SUBSTRATE MATERIAL TUNING

This is a Divisional Application of Ser. No.: 13/665,741 filed Oct. 31, 2012, which is presently pending.

TECHNICAL FIELD

Embodiments of the present invention generally pertain to integrated circuits, and more particularly to interconnects for conveying integrated circuit I/O channels off-chip.

BACKGROUND

High speed signaling poses significant challenges with respect to signal loss between an integrated circuit (IC) operable within a high frequency range and off-chip terminals, such as a dynamic random access memory (DRAM) interface, or an antenna for wireless applications. The cumulative path of a signal channel between the IC and off-chip signal origin/designation generally includes a package of the IC, and may further include an interposer on which the IC is affixed, and/or a board on which the IC or interposer is affixed. Interconnect routing for a given communication channel in the IC package, and/or interposer, and/or board responsible for carrying such high speed signals may employ a transmission line circuit for containing the electromagnetic wave as it is propagated. Such transmission lines are often in the form of a stripline, coplanar waveguide (CPW), or microstrip circuit.

Crosstalk between channels occurs when a signal transmitted on one channel of a transmission system creates an undesired effect in another channel and may be caused by one or more of capacitive, inductive, or conductive coupling between the channels. Interference between two channels as measured at an end of a path opposite from that of the transmitter is referred to as far end crosstalk (FEXT) and, assuming proper termination, is typically more problematic than near end crosstalk (NEXT) measured at the transmitter end of the path.

While transmission line designs can be more or less susceptible to crosstalk, as a function of path layout and geometries, overall channel crosstalk (particularly FEXT) remains a problem in high data bandwidth applications (e.g., exceeding 2.0 Gbyte/sec).

BRIEF DESCRIPTION OF THE DRAWINGS

Embodiments of the present invention are illustrated by way of example, and not limitation, in the figures of the accompanying drawings in which.

DETAILED DESCRIPTION

Figure 1:
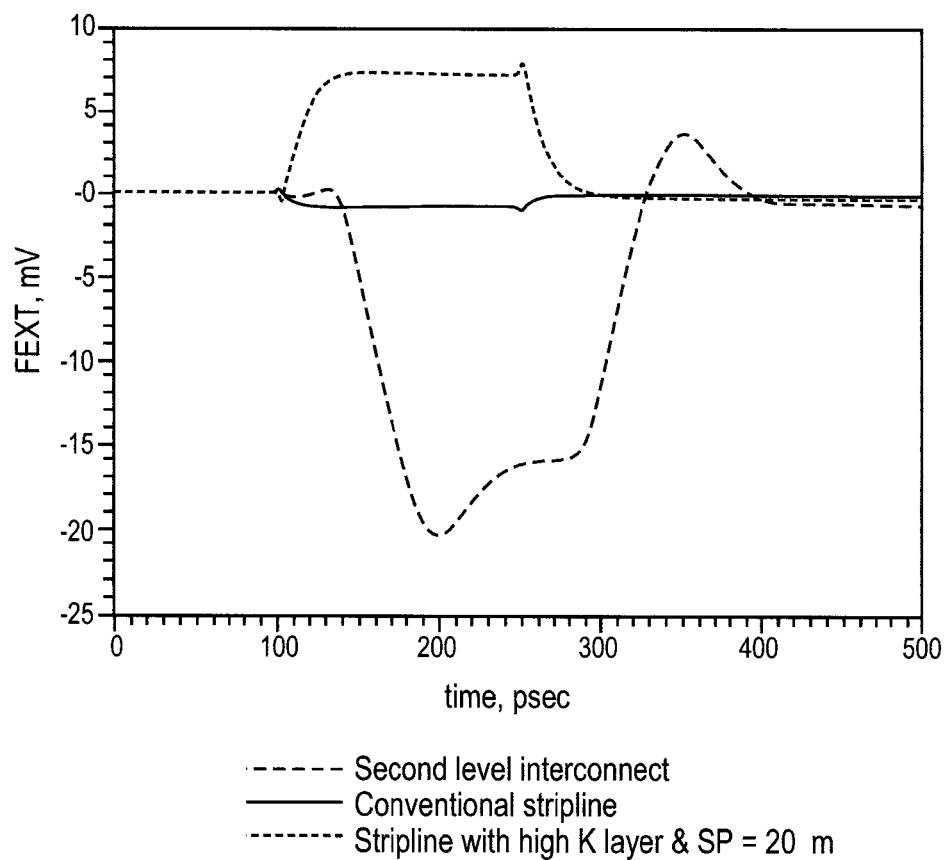
FIG. 1 illustrates a simulation of single-ended FEXT for a second level interconnect, a conventional stripline, and a stripline employing material induced polarity reversal, in accordance with an embodiment of the present invention.

In the following description, numerous details are set forth. It will be apparent, however, to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not structurally or functionally exclusive of the other.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

Generally, reduction in overall crosstalk between channels of an IC are achieved by embodiments described herein through cancellation techniques. It has been found that for many IC input/output (I/O) channels, vertical transitions are major contributors to crosstalk. For example, a decomposition of a DDR4 channel has shown an interposer and socket, and the DIMM connector to be significant crosstalk contributors. IC I/O channels may be either single-ended or differential pairs with typically over one half of the I/Os for many ICs (including certain DDR implementations) being single-ended. FEXT between any single-ended transmission line (e.g., microstrip or stripline) is a function of the mutual capacitive and inductive coupling:

$$FEXT \propto \frac{C_m}{C} - \frac{L_m}{L},$$

where $C_m$ is the mutual capacitance, C is the self-capacitance, $L_m$ is the mutual inductance and L is the self-inductance. For a differential transmission line circuit where an aggressor pair includes lines 1 and 2 and a victim pair includes lines 3 and 4 with line 3 proximate to line 2, the differential FEXT is the combination of 4 single-ended FEXT terms (FEXT$_{diff}$∝FEXT$_{13}$−FEXT$_{23}$−FEXT$_{14}$+FEXT$_{24}$) and is dominated by the FEXT of the two nearest lines with a 180° phase change (−FEXT$_{23}$). As such, channel crosstalk for the differential bus embodiments takes the form $L_m/L-C_m/C$.

Given transmission line FEXT can be made to be essentially zero, in the time domain the overall channel FEXT has negative polarity (i.e., negative for a rising edge excitation) as the vertical transitions noted above are typically inductively dominant. However, because the channel FEXT can be treated as the cumulative effect from all components, the ratio of the mutual capacitance over the self-capacitance ($C_m/C$) associated with the transmission line routing is tuned in embodiments herein to have a positive polarity for a rising edge excitation, and thereby produce a cancellation effect for overall reduction in channel crosstalk. In embodiments herein the dielectric constant of materials utilized within transmission lines is tuned to set the mutual and self capacitance of the transmission line in a manner that does not significantly change other inductance parameters ($L_m$, L). Such transmission lines may, for example, be disposed on one or more of: an IC chip, on a package substrate to which an IC chip is affixed, on an interposer on which a package substrate or an IC chip is affixed, or a board on which a package substrate, an IC, or an interposer is affixed. Although the media may vary as a function of the implementation (i.e., materials for a package-level transmission line circuit may differ from those employed in a board-level transmission line circuit), the exemplary transmission line circuit embodiments described herein generally entail a first dielectric material in-plane with, and separating, signal traces and a second out-of-plane dielectric material separating the signal traces from a ground plane.

In embodiments, mutual capacitance of the transmission line is tuned relative to self-capacitance so as to reverse polarity of FEXT between a victim and aggressor channel relative to that induced by other interconnect portions along the length of the channels, such as inductively coupled portions (e.g., bumps, through vias, sockets, DIMM connectors, motherboard breakout, patch routing, etc.). Depending on the nature of the overall crosstalk between given channels, for example as may be simulated in a full wave field solver, one or more transmission lines may be configured with mutual capacitance increased or reduced relative to self-capacitance to at least partially cancel crosstalk for an overall channel crosstalk reduction. As further described herein, a plurality of dielectric materials (e.g., multi-layered) may be employed within transmission line circuitry to provide an addition degree of freedom in circuitry design, which may be leveraged along with other parameters, such as trace pitch, to achieve a desired crosstalk polarity for the transmission line. Then, cancellation of crosstalk resulting from various components of the channel (i.e., non-transmission line portions) may be achieved through proper sizing of the transmission line length.

For dual-layer dielectric embodiments, dielectric constants may be selected to primarily affect at least one of $C_m$ and C. In advantageous embodiments, the dielectric constant of a material in-plane with a signal trace is tuned for greater efficiency and less disruption to the self terms. Mutual capacitance can be generally expressed, as:

$$C_m = \frac{kA}{d}, \quad \text{(Eq. 2)}$$

where k is the relative permittivity for the material between two conductive traces, A is the overlap area primarily determined by conductor thickness, and d is the distance between the traces. In exemplary embodiments, a transmission line for a single-ended channel includes a material of a higher dielectric constant within the same routing plane as a microstrip or stripline conductor, and a material of a lower dielectric constant between the conductor and the ground plane(s). The high dielectric constant material augments any reduction in trace pitch. Since the dielectric materials above and below the conductive traces are not made to have higher dielectric constant, for example remain at a convention level, the self-capacitance increase is relative small such that $C_m/C$ increases and a positive FEXT polarity achieved. In other exemplary embodiments, a similar effect is achieved in a transmission line for a differential pair where a material of a lower dielectric constant is provided within the same routing plane as a microstrip or stripline conductors, and a material of a higher dielectric constant is provided between the conductors and the ground plane(s).

FIG. 1 illustrates a time domain simulation of single-ended FEXT for a second level interconnect (e.g., bumps, etc.), a conventional stripline, and a stripline with a material induced polarity reversal in accordance with an embodiment of the present invention. As shown, the second level interconnect displays negative FEXT polarity. For the other curves in the simulation, striplines having four 2 mm conductive traces are disposed in a same metallization level. For a stripline designed to contribute nearly zero to the overall channel FEXT, the conductive traces are spaced apart a distance of 85 μm by a conventional dielectric material having a dielectric constant k ($\in_r/\in_0$) of 4. For the stripline with the illustrated polarity reversal, the traces are spaced apart a distance of 20 μm by a dielectric material with a higher dielectric constant of 10. As shown in FIG. 1, the FEXT associated with the stripline having the material induced polarity reversal provides a basis to cancel the FEXT associated with the second level interconnect.

Figure 2:
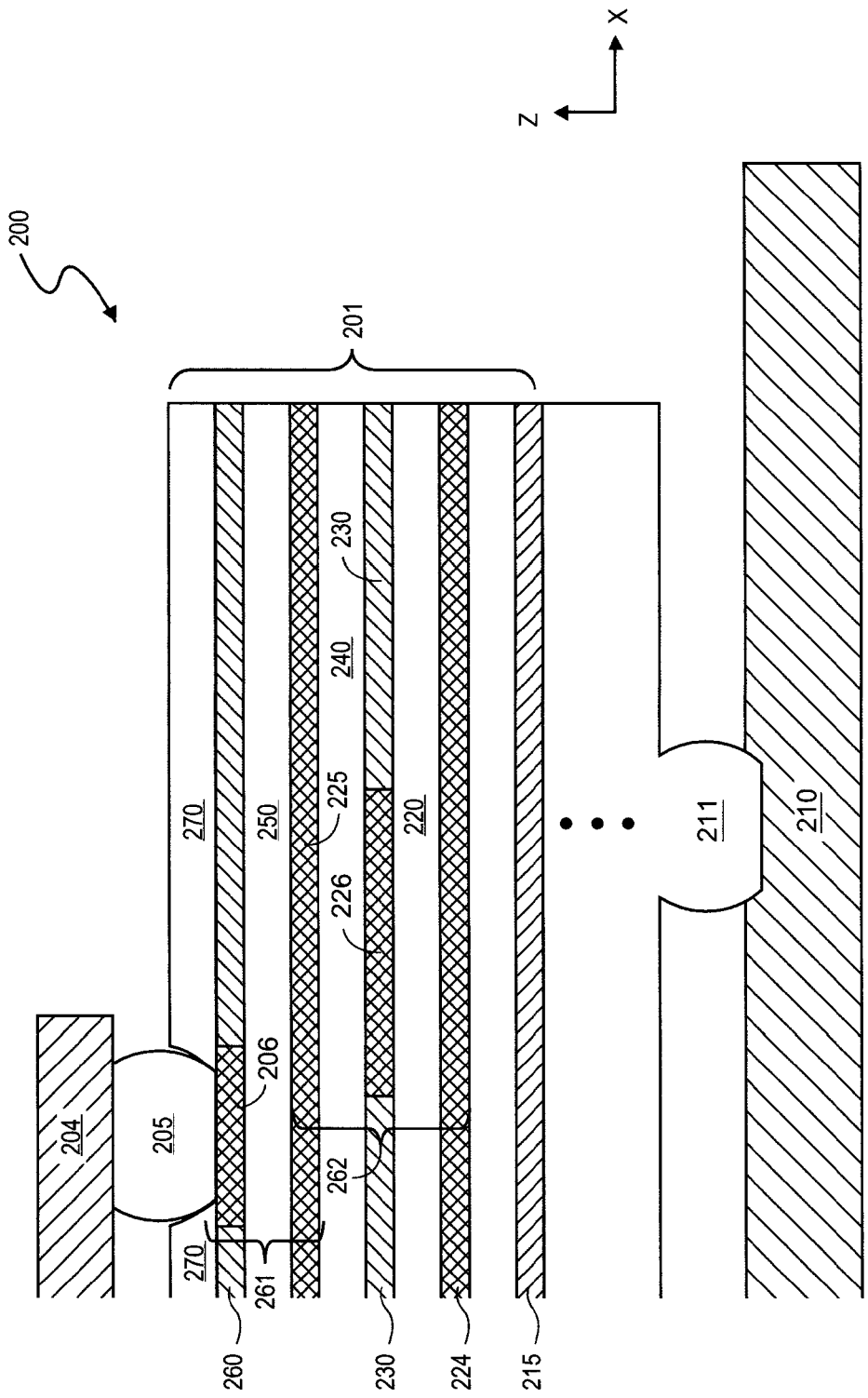
FIG. 2 is a cross-sectional view of a system including an integrated circuit (IC) chip interfacing to a package substrate further interfacing to an interposer or board and illustrating a transmission path in accordance with an embodiment.

FIG. 2 is a cross-sectional view of a system 200 along an arbitrary x-z plane. The system 200 includes an IC chip 204 affixed to a package substrate 201 by first level interconnects 205. The package substrate 201 is further affixed by second level interconnects 211 to an interposer or board 210, such as a printed circuit board (PCB), or the like, to which the package substrate 201 is further coupled. In the exemplary embodiment the first level interconnects 205 is any of solder balls, copper bumps, gold studs or a combination of copper bumps and solder caps, for a flip-chip grid array (FCPGA, FCBGA, etc.) as embodiments of the present invention are applicable to any substrate assembly technologies, such as flip-chip-molded matrix array packages (FCMMAP), eWLB, embedded dies, bumpless assembly, etc.

FIG. 2 illustrates both a package-level microstrip transmission line circuit 261 and a package-level stripline transmission line circuit 262, each of which is a component of an input/output (IO) channel of the IC chip 204 coupling the IC chip 204 to an external, off-chip terminus. Generally, the package substrate 201 includes a substrate (core) 215 and a plurality of build-up layers, with each build-up layer associated with at least one of the transmission lines 261, 262 including an metallization level for trace routing and at least two dielectric layers for electrically insulating laterally adjacent traces as well as adjacent metallization levels (overlying and underlying). In alternative embodiments, a coreless build-up may be utilized in substantially the same manner as described herein. Although a package-level transmission line implementation serves as the vehicle for succinctly describing attributes associated with embodiments of the present invention, alternate embodiments include any implementation analogous to the transmission line circuits 261, 262 along any length within a channel, such as, but not limited to transmission lines implemented within escape routing on the IC chip 204, transmission lines implemented on the interposer or board 210 (within escape routing or main routing), or transmission lines implemented on a second IC to which the IC chip 204 is directly bonded (e.g., on a front or backside of a die in a 3D stacked die).

Referring further to FIG. 2, for the microstrip circuit 261, a conductive trace 206 formed in a top metallization level is disposed over a ground plane 225 disposed in an underlying, second metallization level. In-plane with the conductive trace 206 is a dielectric layer 260, and encapsulating both the conductive trace 206 and the dielectric layer 260 is a solder resist 270. A dielectric layer 250 separates the ground plane 225 from the conductive trace 206. For the stripline circuit 262, a conductive trace 226 formed in a third metallization level is disposed between the overlying ground plane 225 and an underlying ground plane 224. Separating the conductive trace 226 from the ground plane 225 is a dielectric layer 240, and separating the conductive trace 226 from the ground plane 224 is the dielectric layer 220. In-plane with the conductive trace 226 is a dielectric layer 230.

Figure 3A:
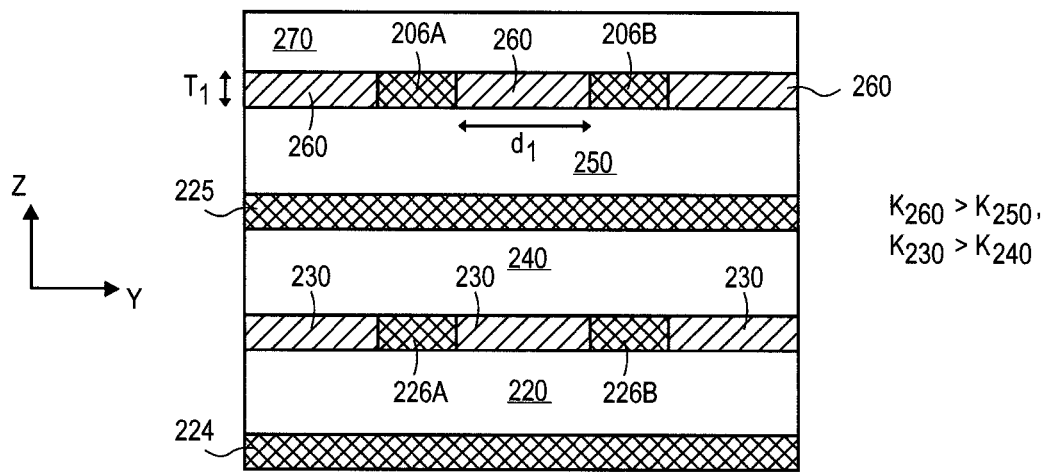
FIG. 3A is a cross-sectional view illustrating single-ended microstrip and stripline transmission lines having a dual layer build-up structure, in accordance with an embodiment.
Figure 3B:
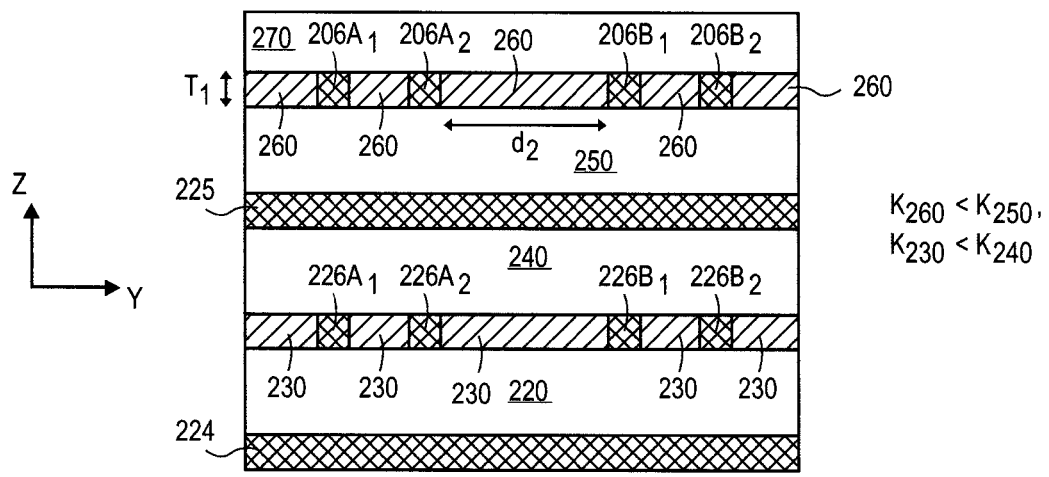
FIG. 3B is a cross-sectional view illustrating differential microstrip and stripline transmission lines having a dual layer build-up structure, in accordance with an embodiment.

FIGS. 3A and 3B further illustrate transmission line portions of the system 200. FIG. 3A provides a cross-sectional view showing single-ended microstrip and stripline transmission lines having a dual layer build-up structure, in accordance with an embodiment. FIG. 3B provides a cross-sectional view illustrating differential microstrip and stripline transmission lines with a dual layer build-up structure, in accordance with another embodiment.

Referring first to FIG. 3A, a single-ended I/O channel (e.g., driven by a single-ended driver on the IC chip 204) includes a first microstrip further comprising a first conductive trace 206A (e.g., a first copper line) disposed over the ground plane 225 while another single-ended I/O channel includes a second microstrip further comprising an adjacent conductive trace 206B (e.g., a second copper line), co-planar with the conductive trace 206A and also disposed over the ground plane 225. Disposed on either side of the traces 206A and 206B is the dielectric layer 260 that is in the exemplary embodiment of a thickness $T_1$ that is approximately equal to that of the traces 206B. The dielectric layer 260 is disposed in-plane with the traces 206A, 206B, occupying the space between them over the distance $d_1$. In embodiments, the dielectric layer 160 has a different dielectric constant than that of the dielectric layer 250 disposed between the ground plane 225 and the traces 206A, 206B. Generally, the difference between these two dielectric constants is advantageously larger for more efficient tuning and permitting polarity reversals at larger trace pitches (which may be more easily manufactured). In embodiments, the difference between the dielectric constants is at least 4, is advantageously over 5, and most advantageously 10, or more. To achieve this difference in dielectric constant, materials for the dielectric layers 250 and 260 may be selected from any material known in the art as having adhesion, thermal, electrical, and mechanical properties suitable for a build-up layer.

In an embodiment, one of the dielectric layers 250 or 260 is a conventional build-up dielectric material, such as a silica-based material typically having a dielectric constant of 3.5-4.0, while the other of the layers 250, 260 may be any low-k (i.e., k=3.0-3.5) ultra low-k (i.e., k<3.0), high-k (i.e., k<8) or ultra high-k (i.e., k>15) material. In another embodiment, one of the dielectric layers 250 or 260 is any low-k or ultra low-k material, while the other of the dielectric layers 250, 260 is a high-k or ultra high-k material. To achieve these material differences in a build-up dielectric layer, any of chemical composition, alloy composition, or matrix, resin, or filler composition may be manipulated within parameters known in the art.

In the exemplary single-ended microstrip embodiment illustrated in FIG. 3A, dielectric layer 250 has a lower dielectric constant than that of the dielectric layer 260. For the reasons noted above (e.g., higher efficiency, reduced disruption to other terms), the dielectric constant of the material in-plane with the signal traces is increased in advantageous embodiments. Thus, for particular embodiments where the dielectric layer 250 is a conventional build-up material having a dielectric constant between 3.5 and 4, the dielectric layer 260 has a dielectric constant greater than at least 4, advantageously at least about 8, and more advantageously at least 10. Although it is advantageous to increase the dielectric constant of the dielectric layer 260 rather than reduce the dielectric constant for the dielectric layer 250, single-ended microstrip embodiments are also possible where the dielectric layer 260 is a conventional build-up material having a dielectric constant of about 3.5 while the dielectric layer 250 is a low-k or ultra low-k material (e.g., with a k of 2.5).

FIG. 3A further illustrates a single-ended I/O channel including a stripline comprising the conductive trace 226A disposed between the underlying and overlying ground planes 224 and 225, respectively. A second single-ended I/O channel includes an adjacent stripline comprising the conductive trace 226B. The adjacent, co-planar traces 226A, 226B are separated by the dielectric layer 230 while the traces 226A, 226B are separated from the ground planes 224, 225 by dielectric layers 220 and 240, respectively. As for the microstrip embodiments, stripline embodiments include a dual-layer build-up dielectric stack where the dielectric layers 220 and 240 are of a same composition and the intervening dielectric layer 230 is of a second composition with distinct dielectric constant. Generally, the dielectric constants of the dielectric layers 230 and 220/240, and their relative relationship, may be as described for the microstrip embodiment. More particularly, the dielectric layer 230 is of a higher dielectric constant than that of the dielectric layers 220 and 240, such that in the depicted stack-up the dielectric constants satisfy the relationships: $k_{260} > k_{250}$ and $k_{230} > k_{240}$. In the exemplary embodiment, the dielectric layer 230 is the same material as the dielectric layer 260 ($k_{260} = k_{230}$) while the dielectric layers 220 and 240 are the same material as the dielectric layer 250 ($k_{250} = k_{240} = k_{220}$).

Referring next to FIG. 3B, a differential I/O channel (e.g., driven by a differential pair driver on the IC chip 204) includes a first microstrip electrically coupled to further comprises a first pair of conductive traces $206A_1$, $206A_2$ (e.g., first pair of copper lines) disposed over the ground plane 225 while another differential I/O channel includes a second microstrip further comprising a second pair of conductive traces $206B_1$, $206B_2$ (e.g., second pair of copper lines), co-planar with the traces $206A_1$, $206A_2$, and also disposed over the ground plane 225. The dielectric layer 260 is disposed along sides of the traces 206A1, 206A2, 206B1, and 206B2 and is again of a thickness $T_1$ that is approximately equal to that of the traces. The dielectric layer 260 is disposed in-plane with the traces, occupying the space between them including the space of distance $d_2$ between the nearest traces of the aggressor/victim pairs.

In embodiments, the dielectric layer 260 has a different dielectric constant than that of the dielectric layer 250 disposed between the ground plane 225 and the traces 206A, 206B. In certain such embodiments, the dielectric layer 260 has a lower dielectric constant than that of the dielectric layer 250. As noted above, because the dominant differential FEXT component is the −FEXT23 term, inductive coupling dominant crosstalk cancellation may be achieved by decreasing $C_m$ within a transmission line, for example by employing a material with a lower dielectric constant in-plane within the signal traces and a material with a higher dielectric constant above and below the signal traces. Differential crosstalk may also be reduced by increasing C by using a material with a higher dielectric constant out-of-plane with the signal traces (e.g., above and below), but again in-plane manipulation should be more efficient and also less disruptive to self terms.

In advantageous embodiments, the dielectric layer 260 is a low-k material (i.e., k<3.5), or ultra-low k material (i.e., k<3.0) while the dielectric layers 230 and 240 are of a conventional material with a dielectric constant between 3 and 4. Of course, as long as the relationship between the dielectric constants is maintained, materials with any of the dielectric constant ranges described for the single-ended embodiments may also be utilized for differential embodiments. For example, the dielectric layers 230 and 240 may be of a high-k material (i.e., k>8) while the dielectric layer 260 is a convention material with a dielectric constant of 3-4, or is a low-k material (k<3.5, k<3.0, etc). However, the dual-layer dielectric build-up stack for differential embodiments is opposite that most beneficial for single-ended embodiments. Thus, where the media or techniques implementing the transmission line embodiments described herein don't allow selective partitioning of materials within a same material layer, the materials for one layer may be applied across all buses (single-ended and differential), and although this may negatively impact one of the buses (single-ended or differential), design rule adjustments (e.g., lager spacing between traces) may be used to mitigate the effect. In certain such embodiments, a dual-layer build up employs a material of higher dielectric constant in-plane with the signal traces for crosstalk cancellation on single-ended channels. These embodiments are advantageous in view of conventional dielectric materials having dielectric constants in the range of 3.5-4 so that there is more latitude to increase, rather than decrease, the dielectric constant. Noting further that tuning the dielectric constant of the in-plane material also has the advantages of higher efficiency and reduced disruption to the "self" terms, it may be more effective to enlist a high-k material across all buses to improve single-ended crosstalk than to use a low-k material across all buses to improve differential crosstalk. For implementations where single-ended channels outnumber differential channels, it is all the more advantageous to enlist a high-k material as the in-plane dielectric across all buses.

Further illustrated in FIG. 3B is a differential I/O channel including a stripline comprising the conductive trace pair $226A_1$ and $226A_2$ disposed between the underlying and overlying ground planes 224 and 225, respectively. A second differential I/O channel includes an adjacent stripline comprising the conductive trace pair $226B_1$ and $226B_2$. The adjacent, co-planar traces 226A1, 226A2, 226B1, and 226B2 are all separated by the dielectric layer 230 and further separated from the ground planes 224, 225 by dielectric layers 220 and 240, respectively. As for the differential microstrip embodiments, differential stripline embodiments include a dual-layer build-up dielectric stack where the dielectric layers 220 and 240 are of a same composition and the intervening dielectric layer 230 is of a second composition with distinct dielectric constant. Generally, the dielectric constants of the dielectric layers 230 and 220/240, and their relative relationship may be as described for the differential microstrip embodiment. More particularly, the dielectric layer 230 is of a lower dielectric constant than that of the dielectric layers 220 and 240, such that in the depicted stack-up the dielectric constants satisfy the relationships: $k_{260}<k_{250}$ and $k_{230}<k_{240}$. In the exemplary embodiment, the dielectric layer 230 is the same material as the dielectric layer 260 ($k_{260}=k_{230}$) while the dielectric layers 220 and 240 are the same material as the dielectric layer 250 ($k_{250}=k_{240}=k_{220}$).

Figure 4A:
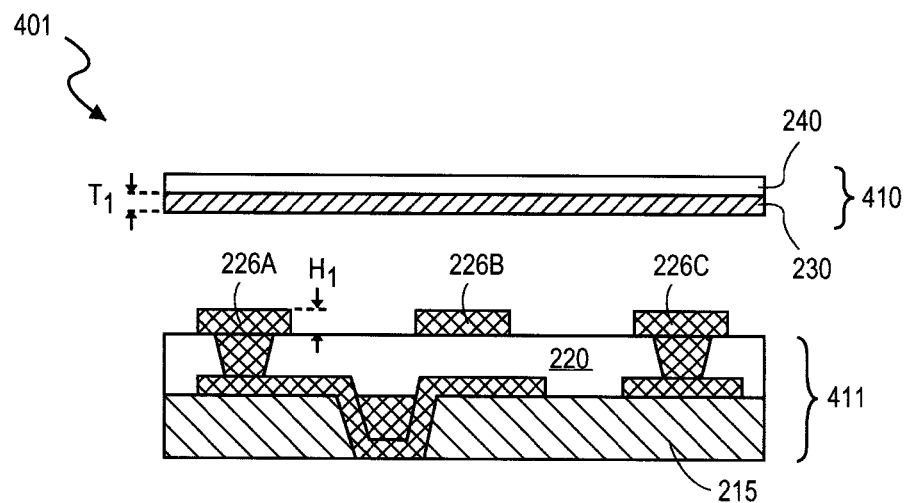
FIGS. 4A and 4B are cross-sectional views illustrating a method of forming a transmission line with a dual layer build-up structure, in accordance with an embodiment.
Figure 4B:
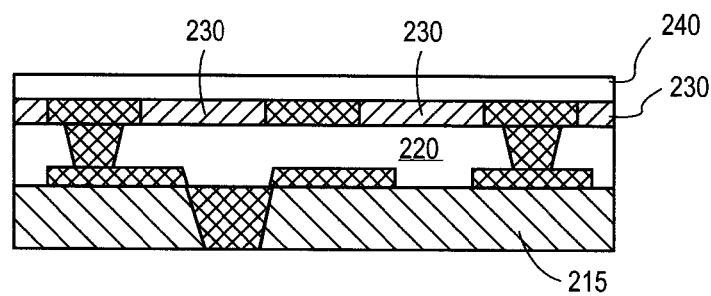

With functional and structural elements of exemplary transmission line circuitry described, methods of fabricating transmission line circuitry in accordance with embodiments are now described. FIGS. 4A and 4B are cross-sectional views illustrating a method 401 of forming a transmission line with a dual layer build-up structure, in accordance with an embodiment. In the method 401, a multi-layered dry dielectric film 410 is laminated onto a receiving substrate 411, such as, but not limited to, a package substrate. As shown, the multi-layered dielectric film 410 includes the dielectric layer 230 bonded to the dielectric layer 240, with the properties of these films being as described elsewhere herein (e.g., in the context of either FIG. 3A or 3B). The multi-layered dielectric film 410 may be applied over the substrate with any lamination technique known in the art applicable to single-layer build-ups.

As shown, signal traces 226A, 226B and 226C defining a transmission line routing path are formed have a z-height of $H_1$ above a top surface of a lower dielectric layer 220 disposed over a substrate 215. The dielectric layer 220 was previously formed using any conventional build-up process. For example, dielectric layer 220 of a desired dielectric constant (e.g., nominal k value of 3.5-4) may be formed with openings, with the signal traces 226A, 226B, and 226C then plated up within the openings in the dielectric layer 220. The thickness of the dielectric layer 230 in the film 410 ($T_1$) is targeted based on the transmission line design, and may for example be approximately equal to the $H_1$ after lamination, in accordance with particular embodiments illustrated in FIG. 4B. In certain embodiments, the dielectric layers 230 and 240 are both thermoplastics, but of differing compositions. In embodiments, the dielectric layer 230 has a lower glass transition temperature than the dielectric layer 240 and may be relatively more flowable and/or deformable at temperature to leave little, if any, of the dielectric layer 230 disposed on top surface of the signal traces 226A-226C. Even for embodiments where there is little, if any, difference in glass transition temperature (or the dielectric layer 240 has a lower transition temperature than that of dielectric layer 230), the signal traces 226A-226C emboss or imprint themselves into the multi-layered dielectric film 410 during lamination so as to leave the dielectric layer 230 primarily in-plane with the traces 226A-226C and dielectric layer 240 primarily only out-of-plane with the traces 226A-226C. The dual-layer dielectric structures for various transmission line embodiments described herein may therefore be formed through repeated application of the multi-layered dielectric film 410 (e.g., to arrive at the stack ups shown in FIGS. 3A and 3B).

Figure 5A:
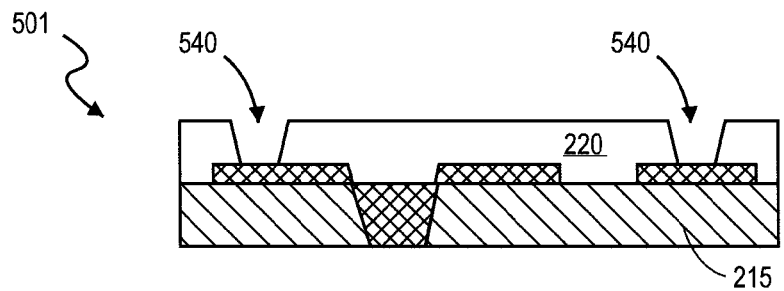
FIGS. 5A, 5B, 5C, 5D, and 5E are cross-sectional views illustrating a method of forming a transmission line with dual layer build-up structure, in accordance with an embodiment.
Figure 5B:
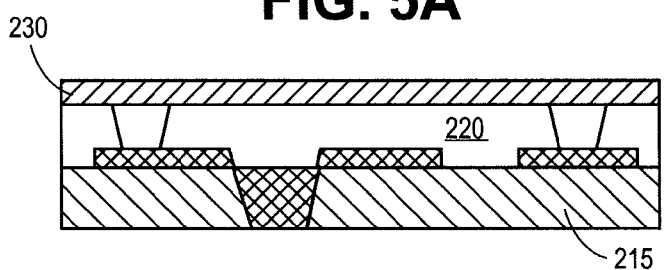

FIGS. 5A, 5B, 5C, 5D, and 5E are cross-sectional views illustrating a method of forming a transmission line with dual layer build-up structure, in accordance with an embodiment. In the method 501, different dielectric material in-plane and out-of-plane of signal traces is provided through application of photo-imageable dielectrics (PIDs). As shown in FIG. 5A, a lower dielectric layer 220 is laminated onto the substrate 215 followed by the formation of vias 540 using conventional techniques. Then, as shown in FIG. 5B, the dielectric layer 230 is applied over the dielectric layer 220. The dielectric layer 230, for example, has the high-k properties described elsewhere herein (e.g., in the context of FIG. 3A). In addition to possessing the desired dielectric constant, the dielectric layer 230 is further photo-imageable, or photo-definable. In the exemplary embodiment depicted in FIG. 5B, the dielectric layer 230 is a dry film selected from the many dry photo-imageable dielectric films recently-developed and commercially available within the packaging arts.

Figure 5C:
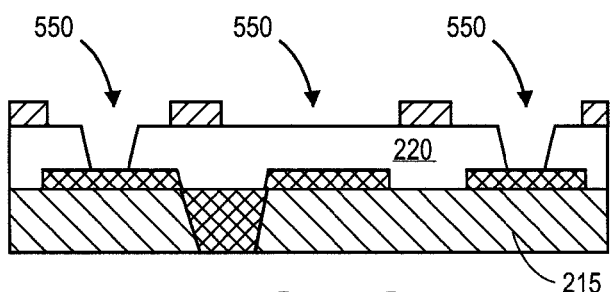
Figure 5D:
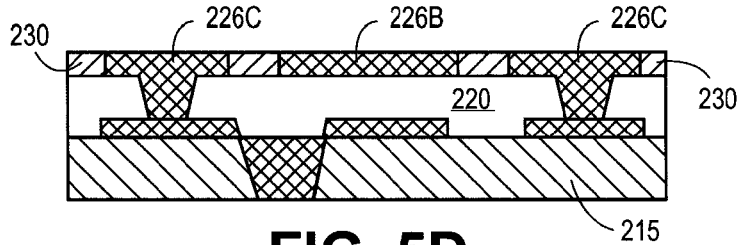
Figure 5E:
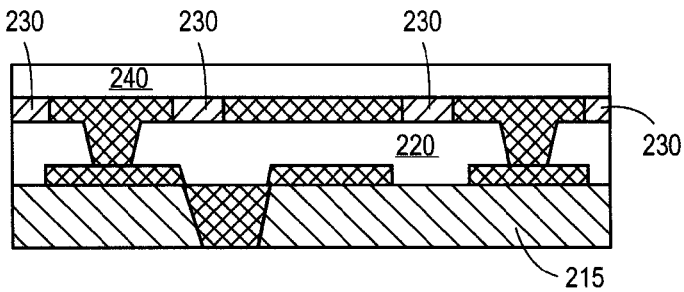

Following lamination of the dielectric layer 230, and as shown in FIG. 5C, the dielectric layer 230 is patterned with any exposure/development process conventional in the art for the particular film composition to form vias 550. As shown, the vias 550 open the vias 540 previously formed in the dielectric layer 220. The vias are then metal filled to form the conductive traces 226A, 226B, and 226C, as further illustrated in FIG. 5D. Any conventional metal fill technique, such as, but not limited to metal (e.g., Cu) seeding, fill metal plating (electrolytic or otherwise), and polishing back the plating overburden, may be utilized to arrive at the structure depicted in FIG. 5D. The dual-layer dielectric structures for various transmission line embodiments described herein may therefore be formed through repeated execution of this technique (e.g., as further illustrated in FIG. 5E with subsequent application of a conventional, or low-k dielectric layer 240) to arrive at the stack ups shown in FIGS. 3A and 3B.

Figure 6A:
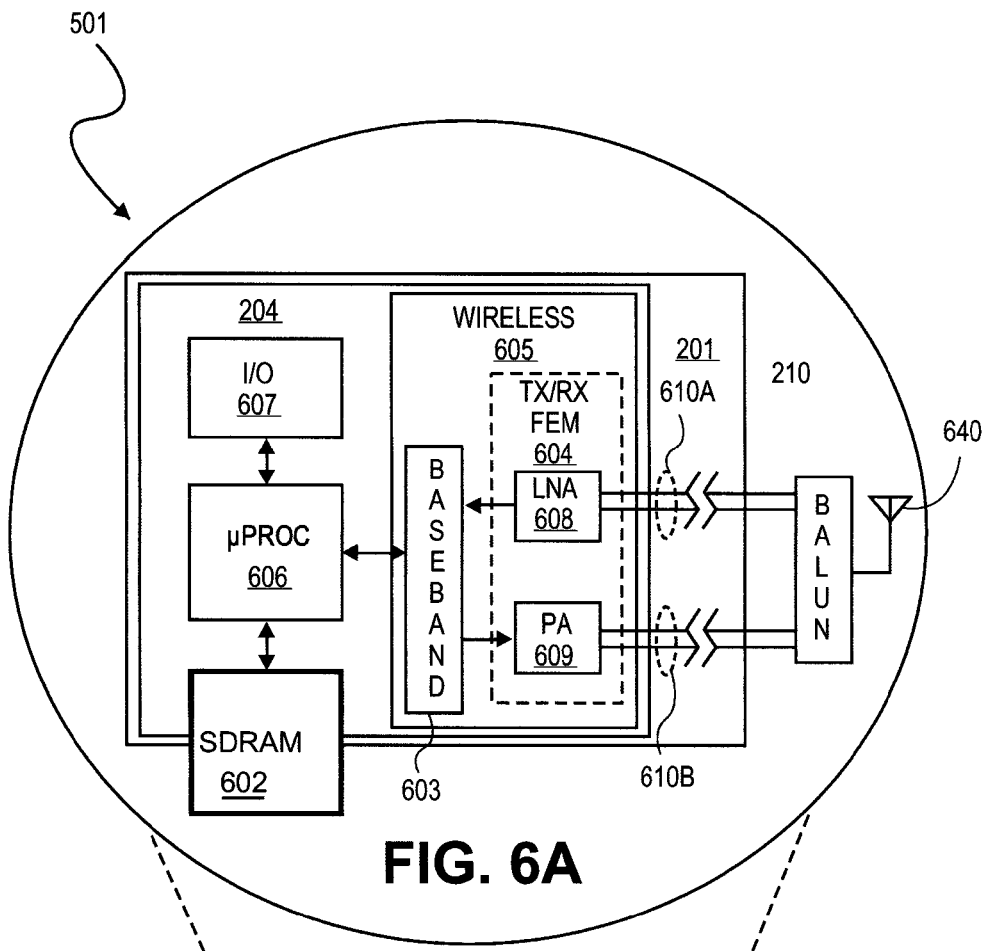
FIG. 6A is a functional block diagram of a system employing a transmission line with a dual layer build-up structure, in accordance with an embodiment.

While the package transmission line circuits described herein may be implemented for a number of high-speed signaling applications, FIG. 6A is an expanded view 501 of a packaged device 710 illustrating a functional block diagram a devices employing a package transmission line according to a few different advantageous embodiments. To illustrate one embodiment, the system 710 includes the IC chip 204 having an RF or wireless module 605 that generally may be of any design known in the art and, more specifically is operable at a frequency of 0.9 GHz, or higher (e.g., 2.4 GHz). The RF module 605 includes an RF signal receiver (Rx), RF signal transmitter (Tx), or RF signal transceiver (Tx/Rx) with a baseband processor 603 and a front end module (FEM) 604 that further includes a low noise amplifier (LNA) 608 on a receiver path and a power amplifier (PA) 609 on a transmit path, as well as filters, mixers, an up-converter to up convert the signal frequency from baseband to RF band, a down-converter to down convert the signal frequency from RF band to baseband, etc., between the baseband processor 603 and antenna 640.

In one exemplary embodiment the IC chip 204 is a system-on-a-chip (SoC) including the wireless (RF) module 605 as well as at least one logic microprocessor core 606 (i.e., an applications processor of the system 601). In an exemplary embodiment, at least one alternate input/output (I/O) interface 607 (e.g., USB, SATA, PCIe, etc.) and a memory 602 (e.g., DDR SDRAM) are further provided in the system 601. In another exemplary embodiment, the IC chip 204 is only a wireless module with the logic processor core 606 and/or alternate I/O interface 607 is provided by a separate/discrete chip that is integrated onto the same package substrate 201 as an (RF) IC chip 204. In other embodiments applicable to a desktop or server computing platform, the IC chip 204 includes the logic processor core 606, but lacks the wireless module 605. For certain such embodiments, the memory 602 is also off the chip 204 (e.g., on the package substrate 204, on a motherboard 210, or on a stacked die).

In embodiments, at least one of the memory 602, logic processor core 606, wireless module 605, and alternate I/O interface 607 is electrically coupled through an embodiment of the transmission line circuits described herein. For example, a high speed communication link between any two of the logic processor core 606, memory 602, RF module 605, and alternate I/O interface 607 may be implemented with an embodiment of the transmission line circuits described herein. In one exemplary embodiment where an off-chip memory 602 entails a DDR SDRAM (e.g., DDR 4 compliant) each byte communicated by the memory 602 contains 8 DQ signals driven by either a single-ended or differential driver. With each of the 8 signals divided into two equal groups, good crosstalk cancellation can be achieved between them with the dual-dielectric layer transmission lines described herein where port assignments and routing rules ensure there are no more than two nearest neighbors so that the maximum number of within byte aggressors is three, or advantageously no more than two. Then with the crosstalk cancellation techniques described herein, the within byte aggressors are reduced to no more than one, and advantageously zero, for a higher bandwidth connection between the IC chip 204 (e.g., core 606) and SDRAM 602.

In another embodiment further illustrated in FIG. 6A, the LNA 608, or a preamplifier, is connected to differential input signal routing 610A which is routed off IC chip 204 and onto the package substrate 210. From the package substrate, the signal is further routed to an RF signal switch, balun, or a feedline of the antenna 640, for example by routing traces on a PCB. An RF signal switch, for example, may include a controlled switch having signal terminals connected to one of the transmission line circuit embodiments described herein. In one exemplary embodiment, the LNA input signal routing on the package substrate 210 is implemented with a transmission line circuit in conformance with those described elsewhere herein. An analogous transmit path may also be provided with a portion of the on-package transmit path 610B between the PA 609 and the antenna 640 employing an embodiment of the transmission line circuits described herein. In another embodiment where the LNA 608 includes a differential input, a transmission line circuit in conformance with the embodiments described herein and implemented with a balanced pair of signal lines that are electrically coupled to the differential input (e.g., a differential driver).

Figure 6B:
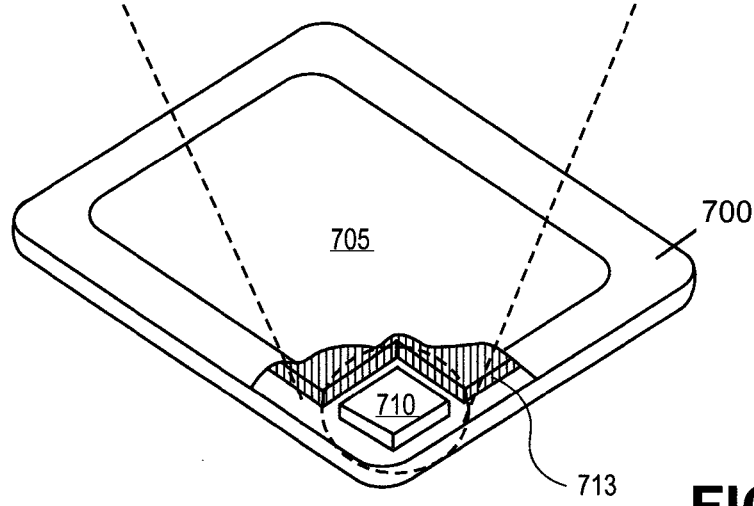
FIG. 6B is an isometric view of a mobile computing device employing the system of FIG. 6A, in accordance with an embodiment.

FIG. 6B is an isometric view of a mobile computing device 700 employing the system 601, in accordance with an embodiment. The mobile computing device or platform 700 may be any portable device configured for each of electronic data display, electronic data processing, and wireless electronic data transmission. For example, the mobile computing device 700 may be any of a tablet, a smart phone, laptop computer, other intent device, etc. and includes a display screen 705, the system 601, and a battery 713. With the package transmission line circuits described herein, the form factor of the packaged system 710 can be reduced relative to convention transmission line circuits, enabling the mobile computing device 700 to either have a concomitantly reduced form factor or a greater region within a given device form factor available to the battery 713 for longest operative lifetimes between charging, or available to memory (not depicted), such as a solid state drive for greatest functionality. Longer operative lifetimes for a given battery size may also be achieved through lower transmission loses which contribute to a reduction in platform power consumption relative those employing conventional transmission line circuits.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of fabricating transmission line circuitry for coupling a first and second input/output (I/O) channel of an integrated circuit (IC) disposed on a chip to an off-chip connection point, the method comprising:
    forming a first conductive trace defining a routing path for the first I/O channel in a first metallization level disposed over a substrate;
    forming a second conductive trace defining a routing path for the second I/O channel in the first metallization level wherein the first I/O channel is separate and electrically isolated from the second I/O channel;
    forming a first dielectric material disposed between the first and second conductive traces;
    forming a ground plane in a second metallization level disposed over the substrate and above or below the first metallization level; and
    forming a second dielectric material disposed between the ground plane and the first and second conductive traces, wherein the second dielectric material has a different dielectric constant than that of the first dielectric material.

2. The method of claim 1, wherein forming the first and second dielectric materials further comprises laminating a multi-layered film over the first and second conductive traces.

3. The method of claim 1, wherein forming the second dielectric layer comprises laminating the second dielectric layer onto the first dielectric layer, and wherein forming the first and second conductive traces further comprises:
    forming openings of different lateral dimensions in the first and second dielectric layers; and
    depositing metallization into the openings.

4. The method of claim 3, wherein the second dielectric layer is laminated onto the first dielectric layer after openings are formed in the first dielectric layers.

5. The method of claim 1 wherein the first and second conductive traces are first and second single ended conductive traces and wherein the first dielectric has a first dielectric constant and the second dielectric has a second dielectric constant wherein the first dielectric constant is greater than the second dielectric constant.

6. A method of fabricating transmission line circuitry for coupling a first and second input/output (I/O) channel of an integrated circuit (IC) disposed on a chip to an off-chip connection point, the method comprising:
    forming a first conductive trace defining a routing path for the first I/O channel in a first metallization level disposed over a substrate;
    forming a second conductive trace defining a routing path for the second I/O channel in the first metallization level, the second conductive trace coplanar with the first conductive trace, the first conductive traces having a thickness;
    forming a first dielectric material disposed between the first and second conductive traces, the first dielectric material inplane with the first conductive trace, and the second conductive trace and having a thickness that is approximately equal to the thickness of the first conductive trace;
    forming a ground plane in a second metallization level disposed over the substrate and above or below the first metallization level; and
    forming a second dielectric material disposed between the ground plane and the first and second conductive traces, wherein the second dielectric material has a different dielectric constant than that of the first dielectric material, and wherein the first I/O channel is separate and electrically isolated from the second I/O channel.

7. The method of claim 6, wherein forming the first and second dielectric materials further comprises laminating a multi-layered film over the first and second conductive traces.

8. The method of claim 6, wherein forming the second dielectric layer comprises laminating the second dielectric layer onto the first dielectric layer, and wherein forming the first and second conductive traces further comprises:
    forming openings of different lateral dimensions in the first and second dielectric layers; and
    depositing metallization into the openings.

9. The method of claim 8, wherein the second dielectric layer is laminated onto the first dielectric layer after openings are formed in the first dielectric layers.

10. The method of claim 6, wherein the first and second conductive traces are first and second single ended conductive traces and wherein the first dielectric has a first dielectric constant and the second dielectric has a second dielectric constant wherein the first dielectric constant is greater than the second dielectric constant.

11. A method of fabricating transmission line circuitry for coupling a first differential input/output (I/O) channel and second differential input/output (I/O) channel of an integrated circuit (IC) disposed on a chip to an off-chip connection point, the method comprising:
    forming a first pair of conductive trace defining a routing path for the first differential I/O channel in a first metallization level disposed over a substrate;
    forming a second pair of conductive traces defining a routing path for the second differential I/O channel in the first metallization level, the second pair of conductive traces coplanar with the first pair of conductive traces, the first pair of conductive traces having a thickness;
    forming a first dielectric material disposed between the first and second pairs of conductive traces, the first dielectric material inplane with the first pair of conductive traces, and the second pair of conductive traces and having a thickness that is approximately equal to the thickness of the first pair of conductive traces;
    forming a ground plane in a second metallization level disposed over the substrate and above or below the first metallization level; and
    forming a second dielectric material disposed between the ground plane and the first and second paisr of conductive traces, wherein the second dielectric material has a different dielectric constant than that of the first dielectric material, and wherein the first I/O channel is separate and electrically isolated from the second I/O channel.

12. The method of claim 11, wherein forming the first and second dielectric materials further comprises laminating a multi-layered film over the first and second pairs of conductive traces.

13. The method of claim 11, wherein forming the second dielectric layer comprises laminating the second dielectric layer onto the first dielectric layer, and wherein forming the first and second pair of conductive traces further comprises:
   forming openings of different lateral dimensions in the first and second dielectric layers; and
   depositing metallization into the openings.

14. The method of claim 13, wherein the second dielectric layer is laminated onto the first dielectric layer after openings are formed in the first dielectric layers.

15. The method of claim 11, wherein the first dielectric has a first dielectric constant and the second dielectric has a second dielectric constant wherein the first dielectric constant is less than the second dielectric constant.

\* \* \* \* \*